(12) United States Patent
Baba et al.

(10) Patent No.: US 7,608,488 B2
(45) Date of Patent: Oct. 27, 2009

(54) SEMICONDUCTOR MEMORY DEVICE AND METHOD OF MANUFACTURING THE SAME

(75) Inventors: Yasuyuki Baba, Yokohama (JP); Susumu Yoshikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 11/874,481

(22) Filed: Oct. 18, 2007

(65) Prior Publication Data
US 2008/0258201 A1 Oct. 23, 2008

(30) Foreign Application Priority Data
Oct. 27, 2006 (JP) .............................. 2006-292691

(51) Int. Cl.
*H01L 21/82* (2006.01)
(52) U.S. Cl. ............... 438/128; 257/316; 257/E21.791; 438/294; 438/587
(58) Field of Classification Search ................. 438/128, 438/294, 587; 257/316, E21.179
See application file for complete search history.

(56) References Cited

U.S. PATENT DOCUMENTS 7,138,314 B2  11/2006  Song et al.

2005/0093047 A1  5/2005  Goda et al.
2005/0106822 A1  5/2005  Lee et al.

*Primary Examiner*—Thao X Le
*Assistant Examiner*—Matthew Gordon
(74) *Attorney, Agent, or Firm*—Oblon, Spivak, McClelland, Maier & Neustadt, L.L.P.

(57) ABSTRACT

A manufacturing method of a semiconductor memory device for manufacturing a first semiconductor device and a second semiconductor device wherein a cell array ratio is smaller than that of the first semiconductor device, said manufacturing method has forming the height of first element-isolating insulating films of first memory cell array region of said first semiconductor device so as to be a predetermined height, by performing etching treatment under predetermined conditions using a first etching mask having a first opening for exposing the entirety of said first memory cell array region, and forming the height of second element-isolating insulating films of second memory cell array region and part of peripheral circuit region of said second semiconductor device so as to be the predetermined height, by performing etching treatment under said predetermined conditions using a second etching mask having a second opening for exposing the entirety of said second memory cell array region and a third opening for exposing part of said peripheral circuit region.

7 Claims, 11 Drawing Sheets

SEMICONDUCTOR MEMORY DEVICE AND METHOD OF MANUFACTURING THE SAME

CROSS REFERENCE TO RELATED APPLICATION

This application is based upon and claims benefit of priority from the Japanese Patent Application No. 2006-292691, filed on Oct. 27, 2006, the entire contents of which are incorporated herein by reference.

BACKGROUND OF THE INVENTION

The present invention relates to a semiconductor memory device and a method of manufacturing the same.

Among nonvolatile semiconductor memory devices, a flash memory, for example, has a structure in which gate oxide films are formed on a semiconductor substrate and polysilicon films are formed on the gate oxide films as floating gate electrodes.

On the semiconductor substrate, there are formed element-isolating trenches to isolate the floating gate electrodes of memory cells. Element-isolating insulating films are buried in the trenches and are etched so that the top surface thereof is higher than the surface of the semiconductor substrate but is lower than the top surface of the floating gate electrodes.

An insulating film for covering the floating gate electrodes and the element-isolating insulating films is formed and a polysilicon film for forming control gate electrodes is further formed on the insulating film.

Since the top surface of the element-isolating insulating films is lower than the top surface of the floating gate electrodes, the insulating film is of concavo-convex shape according to the surface shapes of the underlying floating gate electrodes and the element-isolating insulating films.

In addition, the bottom surface of the control gate electrodes is also of concavo-convex shape according to the surface shape of the underlying insulating film.

By applying such a structure as described above, it is possible to secure surface areas, with respect to the insulating film formed between the floating gate electrodes and the control gate electrodes, also on the lateral sides of each floating gate electrode, thereby making it possible to increase the coupling capacitance and coupling ratio.

The chip of the semiconductor memory device has a memory cell array portion and a peripheral portion. Since the etching of the above-described element-isolating insulating films is carried out in order to increase the coupling capacitance or coupling ratio, only an area within the memory cell array portion is etched. Thus, no etching is performed on the peripheral portion for which the coupling capacitance need not be increased. In other words, the peripheral portion is masked when etching the element-isolating insulating films.

However, if element-isolating insulating films are etched under the same conditions (time) when manufacturing products wherein the occupation ratios of memory cell array portions in chips differ, the amount of element-isolating insulating films to be etched away also differs product by product since the opening ratio of an etching mask differs product by product.

Consequently, there arises a difference in the height of the element-isolating insulating films from the surface of the semiconductor substrate. Since the coupling ratio varies if this height changes, there arises a difference in program voltage.

Accordingly, a variation may arise in the program voltage of products wherein the occupation ratios of memory cell array portions differ, thereby degrading product reliability.

SUMMARY OF THE INVENTION

According to one aspect of the present invention, there is provided a semiconductor memory device comprising:

a semiconductor substrate having a memory cell region and a peripheral circuit region;

a plurality of first trenches formed in said memory cell region on the surface of said semiconductor substrate at predetermined intervals in a strip-shaped manner along a first direction;

first element-isolating insulating films respectively buried in said first trenches so that the top surface thereof is formed so as to be higher than the top surface of said semiconductor substrate;

a plurality of floating gate electrodes formed on the surface of said semiconductor substrate between said first trenches through a gate-insulating film at predetermined intervals along said first direction, so that the top surface thereof is higher than said first element-isolating insulating films;

a plurality of control gate electrodes formed above said floating gate electrodes through an inter-electrode insulating film at predetermined intervals in a strip-shaped manner along a second direction orthogonal to said first direction;

second trenches formed in said peripheral circuit region on the surface of said semiconductor substrate;

second element-isolating insulating films buried in said second trenches so that the top surface thereof is formed to be level with the height of said first element-isolating insulating films;

first lower conducting layers formed on the surface of said semiconductor substrate in areas partitioned by said second trenches through a gate-insulating film, so that the top surface height thereof is the same as the height of said floating gate electrodes;

first upper conducting layers formed above said first lower conducting layers;

third trenches formed in said peripheral circuit region on the surface of said semiconductor substrate;

second lower conducting layers formed on the surface of said semiconductor substrate in areas partitioned by said third trenches through a gate-insulating film, so that the top surface height thereof is the same as the height of said floating gate electrodes;

third element-isolating insulating films buried in said third trenches and formed so that the top surface height thereof is the same as the height of said second lower conducting layers; and second upper conducting layers formed above said second lower conducting layers so as to be electrically connected with said first lower conducting layers.

According to one aspect of the present invention, there is provided a manufacturing method of a semiconductor memory device for manufacturing a first semiconductor device wherein a cell array ratio at which an area occupied by a memory cell array region with respect to the entire surface area of a semiconductor substrate is a predetermined ratio and a second semiconductor device wherein said cell array ratio is smaller than said predetermined ratio, said manufacturing method comprising:

forming the height of first element-isolating insulating films in first memory cell array region of said first semiconductor device wherein first electrode layers and the first element-isolating insulating films, the heights thereof from said semiconductor substrate being a first height, are formed, so as to be a second height smaller than the first height, by performing etching treatment under predetermined conditions using a reactive ion etching method upon the entirety of the first memory cell array region using a first etching mask having a first opening for exposing the entirety of said first memory cell array region and a ratio at which the area of said first opening occupies part of the entire surface area of said semiconductor substrate is a predetermined opening ratio; and forming the height of second element-isolating insulating films in second memory cell array region and part of peripheral circuit region of said second semiconductor device wherein second electrode layers and the second element-isolating insulating films, the heights thereof from said semiconductor substrate being the same as said first height, are formed, so as to be the same as said second height, by performing etching treatment under conditions same as said predetermined conditions using a reactive ion etching method upon the second memory cell array region and the part of peripheral circuit region using a second etching mask having a second opening for exposing the entirety of said second memory cell array region and a third opening for exposing part of said peripheral circuit region wherein a ratio at which the sum of the areas of said second and third openings occupies part of the entire surface area of said second semiconductor substrate is the same as said predetermined opening ratio.

DESCRIPTION OF THE EMBODIMENTS

Hereinafter, an explanation will be made of the embodiments of a semiconductor memory device in accordance with the present invention.

Figure 1:
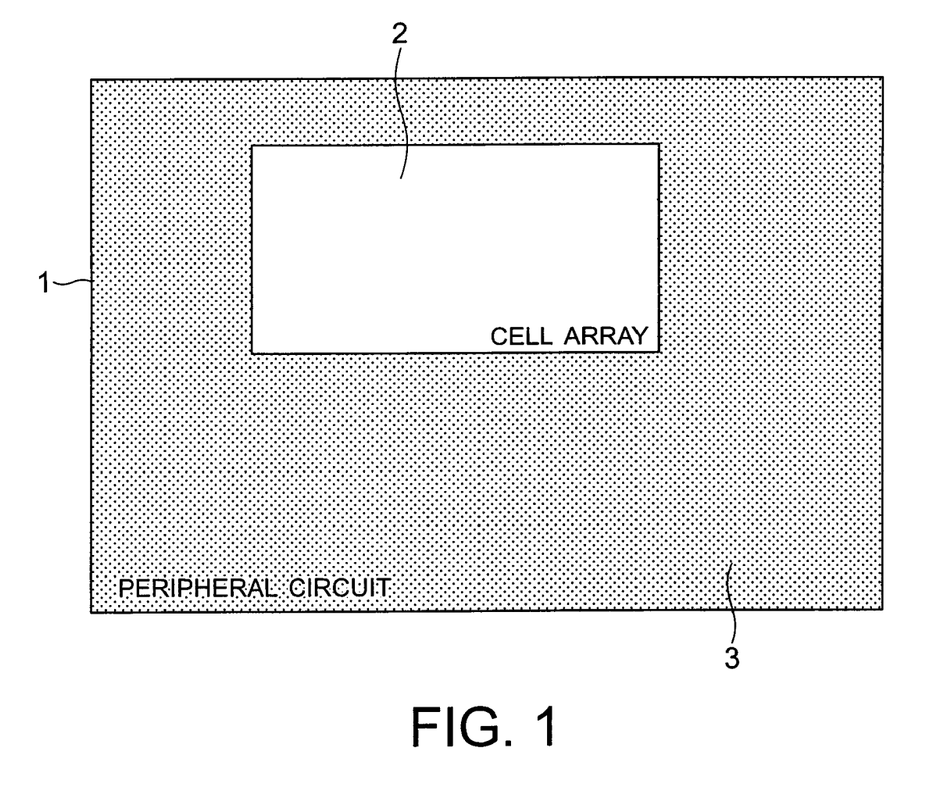
FIG. 1 is a schematic view illustrating the approximate configuration of a semiconductor memory device in accordance with an embodiment of the present invention.

FIG. 1 shows the approximate chip configuration of a semiconductor memory device in accordance with an embodiment of the present invention. A chip 1 has a cell array portion 2 which is a memory cell array region wherein memory cell transistors are formed and a peripheral portion 3 which is a peripheral circuit region wherein high breakdown voltage transistors and low breakdown voltage transistors for driving the memory cell transistors are formed.

If semiconductor devices of the same size differ in memory cell capacitance, the occupation ratio of the cell array portion 2 with respect to the chip 1 also differs. Here, an explanation will be made of a semiconductor device wherein the chip occupation ratio of the cell array portion 2 is small.

Figure 2:
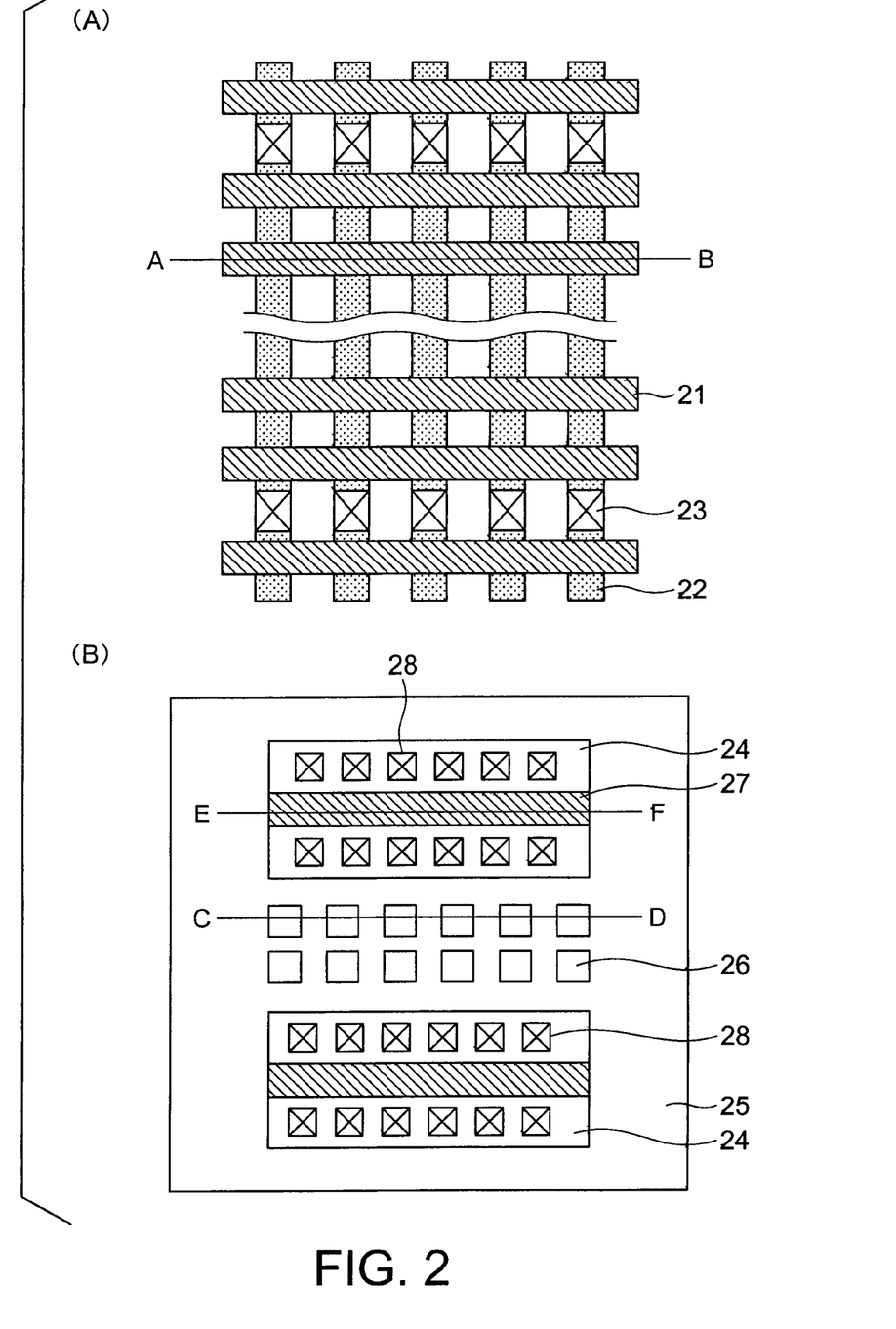
FIG. 2 is a schematic view illustrating the top surface of the semiconductor memory device in accordance with the aforementioned embodiment.

FIG. 2(A) shows the top view of the cell array portion 2. Memory cells have a plurality of control gate electrodes 21 formed at predetermined intervals along a first direction (horizontal direction in the figure), a plurality of element regions 22 formed at predetermined intervals along a second direction orthogonal to the first direction (vertical direction in the figure), and contact portions 23 provided on the element regions 22. In a position on the semiconductor substrate where each control gate electrode 21 and each element region 22 intersect with each other, there is formed a floating gate electrode.

FIG. 2(B) shows the top view of the peripheral portion 3. The peripheral portion 3 has element regions 24 where high breakdown voltage transistors and low breakdown voltage transistors for driving memory cell transistors are formed, a dummy pattern 26, and element-isolating regions 25 for partitioning the element regions 24 and the dummy pattern 26. Strip-shaped upper conducting layers 27 are formed in the element regions 24 along the horizontal direction of the figure and contacts 28 are formed above and below the upper conducting layers 27.

The dummy pattern 26 is a pattern formed to a film thickness the same as that of the gate electrode of each memory cell transistor, in order to prevent dishing (a phenomenon in which a dish-like recess is produced in a wiring line when the wiring line is polished and planarized using a chemical-mechanical polishing (CMP) method). The dummy pattern 26 is electrically isolated from other circuit elements.

Next, an explanation will be made of the cross-sectional configuration of each memory cell transistor by showing in FIG. 3(A) part of the vertical section along the line A-B of FIG. 2(A). Gate insulating films 33 are formed on element regions in a strip-shaped manner along the vertical direction of a semiconductor substrate 31 in FIG. 2(A), and floating gate electrodes 34 are formed on these gate insulating films 33. The gate insulating films 33 and the floating gate electrodes 34 are respectively divided by element-isolating regions 32 into a plurality of regions.

These element-isolating regions 32 are formed in trenches in a strip-shaped manner along the vertical direction of FIG. 2(A) by burying element-isolating insulating films. The element-isolating regions (element-isolating insulating films) 32 are formed so that the top surface thereof is positioned higher than the surface of the semiconductor substrate 31 but lower than the top surface of the floating gate electrodes 34.

On the floating gate electrodes 34 and the element-isolating regions 32, there is formed an inter-electrode insulating film 35 composed of, for example, an ONO film (film having a laminated structure composed of a silicon dioxide film-silicon nitride film-silicon dioxide film stack) or the like which is an inter-electrode insulating film. The insulating film 35 is of concavo-convex shape according to the surface shapes of the underlying floating gate electrodes 34 and the element-isolating regions 32.

Control gate electrodes 21 extending in the horizontal direction of FIG. 2(A) are formed on this insulating film 35. The bottom surface of these control gate electrodes 21 is of concavo-convex shape according to the surface shape of the underlying insulating film 35. The floating gate electrodes 34 and the control gate electrodes 21 are composed of, for example, a polysilicon layer.

Figure 3:
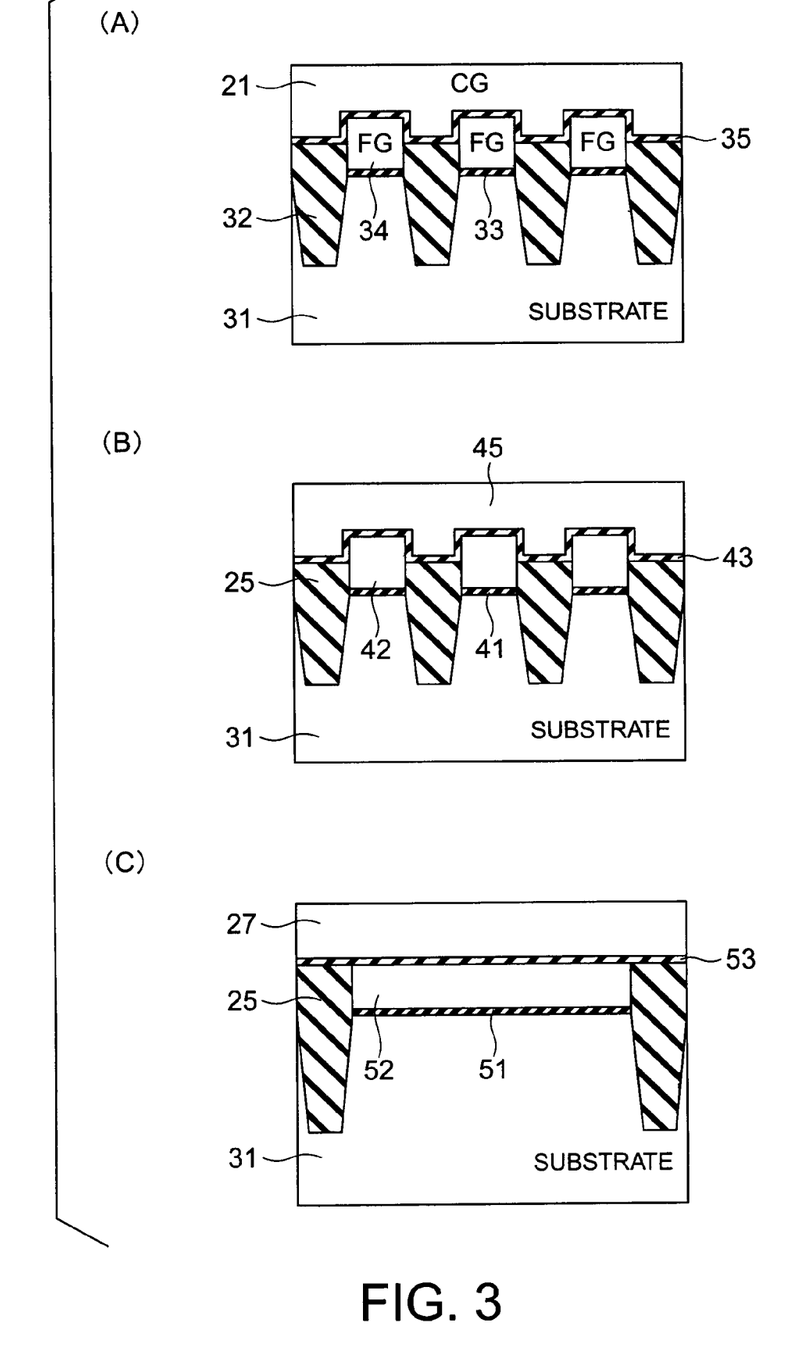
FIG. 3 is a schematic view illustrating the cross section of the semiconductor memory device in accordance with the aforementioned embodiment.

As shown in FIG. 3(A), the insulating film 35 and the control gate electrodes 21 are also located on the upper lateral sides of the floating gate electrodes 34. Accordingly, it is possible to secure surface areas required with respect to the insulating film 35 formed between the floating gate electrodes 34 and the control gate electrodes 21, thereby making it possible to increase the coupling capacitance and coupling ratio.

Next, an explanation will be made of the cross-sectional configuration of dummy cells by showing in FIG. 3(B) part of the vertical section along the line C-D of FIG. 2(B). Gate-insulating films 41, the thickness of which is the same as that of the gate-insulating films 33, are formed on the semiconductor substrate 31. On these gate-insulating films 41, there are formed first lower conducting layers 42 the same in film thickness as the floating gate electrodes 34 and composed of a polysilicon layer.

The lower conducting layers 42 and the gate-insulating films 41 are divided into a plurality of portions by the element-isolating regions (element-isolating insulating films) 25 for partitioning the element regions 24 of the peripheral portion. The top surface of the element-isolating regions 25 is formed so as to be positioned level with the top surface of the element-isolating regions 32 but lower than the top surface of the lower conducting layers 42.

An insulating film 43 the same in thickness as the insulating film 35 and composed of, for example, an ONO film is formed on the lower conducting layers 42 and the element-isolating regions 25. The insulating film 43 is of concavo-convex shape according to the surface shapes of the lower conducting layers 42 and the element-isolating regions 25.

On the insulating film 43, there are formed first upper conducting layers 45 the same in film thickness as the control gate electrodes 21 and composed of a polysilicon layer.

Next, an explanation will be made of the cross-sectional configuration of a low breakdown voltage transistor which is one of the circuit elements disposed in the peripheral portion 3, by showing in FIG. 3(C) part of the cross section along the line E-F of FIG. 2(B). A gate-insulating film 51 the thickness of which is the same as that of the gate-insulating film 33 is formed on the semiconductor substrate 31.

On this gate-insulating film 51, there is formed a second lower conducting layer 52 the same in film thickness as the floating gate electrodes 34 and composed of a polysilicon layer. The lower conducting layer 52 and the gate-insulating film 51 are surrounded by the element-isolating regions 25 for partitioning the element regions 24 of the peripheral portion.

An insulating film 53 the same in thickness as the insulating film 35 and composed of, for example, an ONO film is formed on the lower conducting layer 52 and the element-isolating regions 25. The height of the lower conducting layer 52 from the semiconductor substrate 31 is the same as that of the element-isolating regions 25 and is formed so as to be level with the floating gate electrodes 34 shown in FIG. 3(A).

A second upper conducting layer 27 composed of, for example, a polysilicon layer is formed on the insulating film 53 to a film thickness the same as that of the control gate electrodes 21.

Note that the insulating film 53 is partially removed on the lower conducting layer 52, and the lower conducting layer 52 and the upper conducting layer 27 are electrically connected to each other through the portion thus removed.

Figure 4:
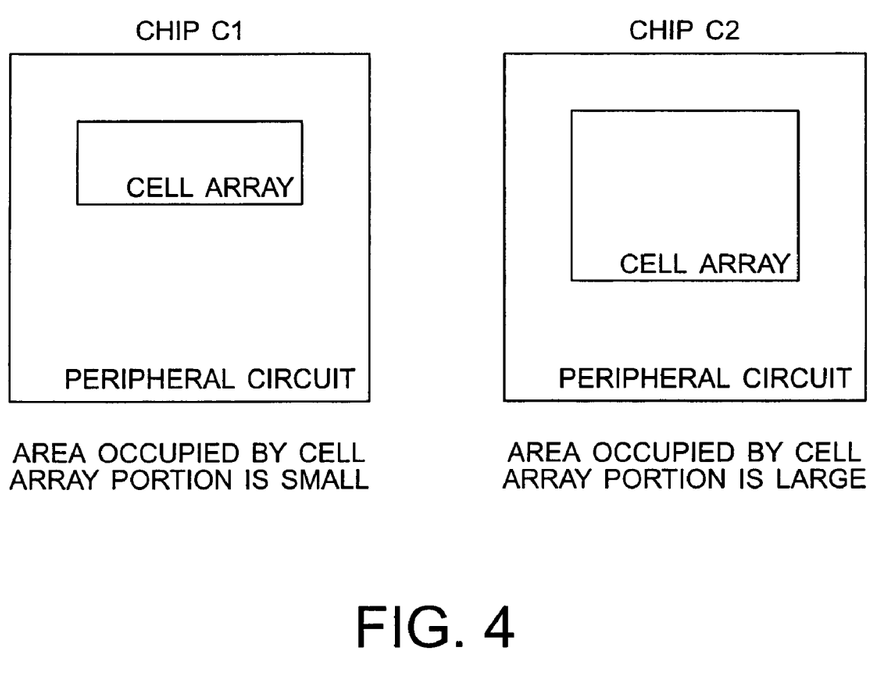
FIG. 4 is a schematic view illustrating the approximate configurations of chips wherein the areas occupied by cell array portions differ.

As shown in FIG. 4, when etching (dropping) the element-isolating regions of such a chip (chip C1) wherein the occupation area of a cell array portion is small as described above, such etching is performed not only on the cell array portion but also on the element-isolating regions of a dummy pattern in a peripheral portion. The purpose of this is to make the opening ratio of an etching mask agree with that of an etching mask used when etching the element-isolating regions of a chip (chip 2) wherein the occupation area of a cell array portion is large.

By making the opening ratios of etching masks agree with each other among a plurality of types of semiconductor substrates having the same size wherein the occupation ratios of cell array portions differ, it is possible to keep constant the height of the element-isolating regions from the semiconductor substrate in the cell array portion with the same etching time (conditions), irrespective of the occupation ratio of the cell array portion in the chip. Consequently, the coupling ratio does not vary product by product and thus it is possible to manufacture products of high quality.

Now, a method of manufacturing a semiconductor memory device in the present embodiment will be described while making comparisons with respect to cell array portions and to dummy pattern regions and to element regions in a peripheral portion, using FIGS. 5 to 8. Note that symbols (A), (B) and (C) in each of FIGS. 5 to 8 correspond to those of FIG. 3. In addition, the drawings of FIGS. 5 to 8 are only schematic representations and, therefore, dimensions, the ratios between the thicknesses of respective layers, and the like differ from what they actually are.

Figure 5:
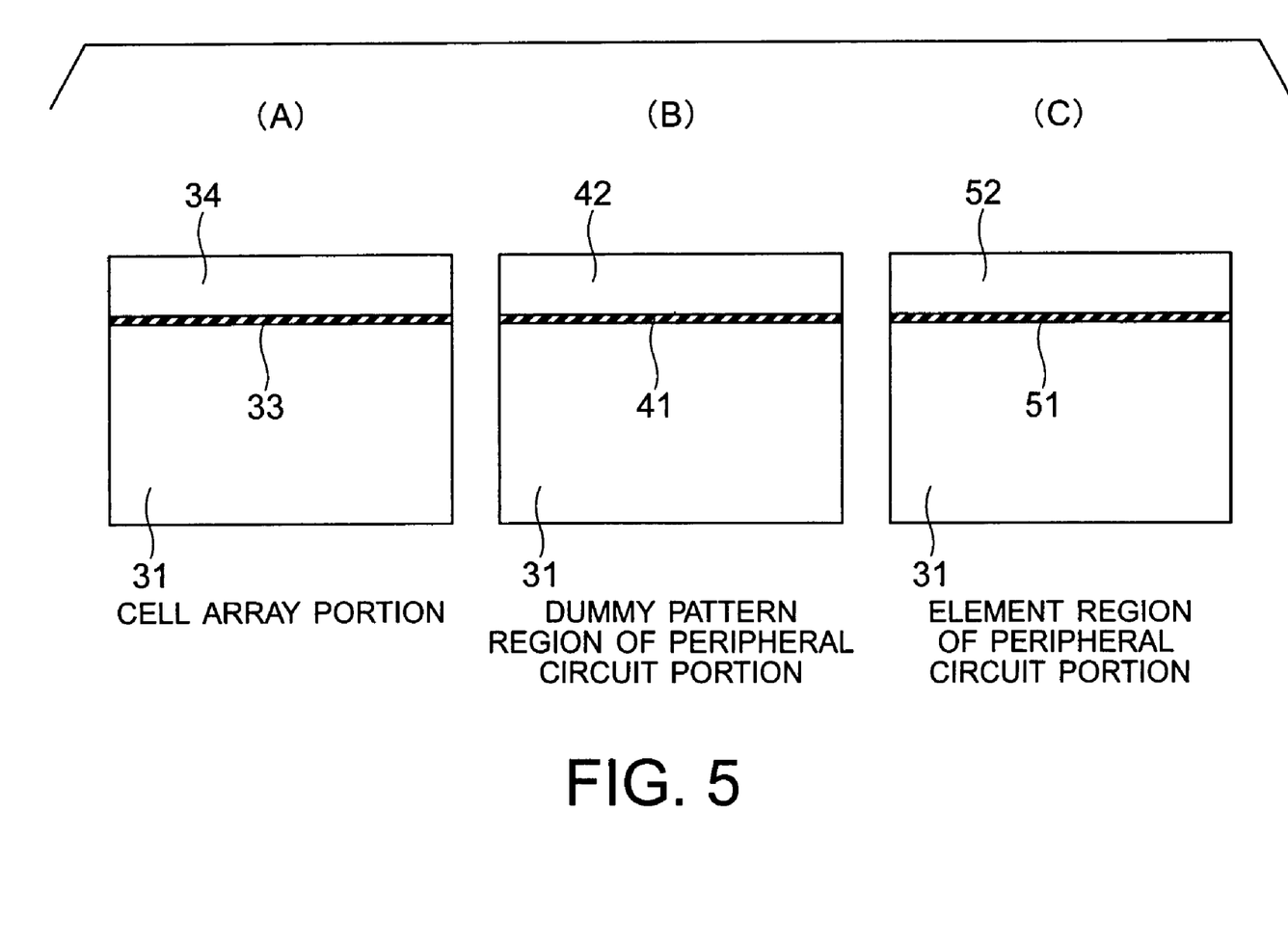
FIG. 5 is a schematic view illustrating cross sections in one process showing a method of manufacturing the semiconductor memory device in accordance with the aforementioned embodiment.

First, as shown in FIGS. 5(A), 5(B) and 5(C), gate-insulating films 33, 41 and 51 composed of a silicon dioxide film or the like and electrode layers 34, 42 and 52 composed of a polysilicon or the like are successively deposited on a semiconductor substrate 31 using a chemical vapor deposition (CVD) method.

Figure 6:
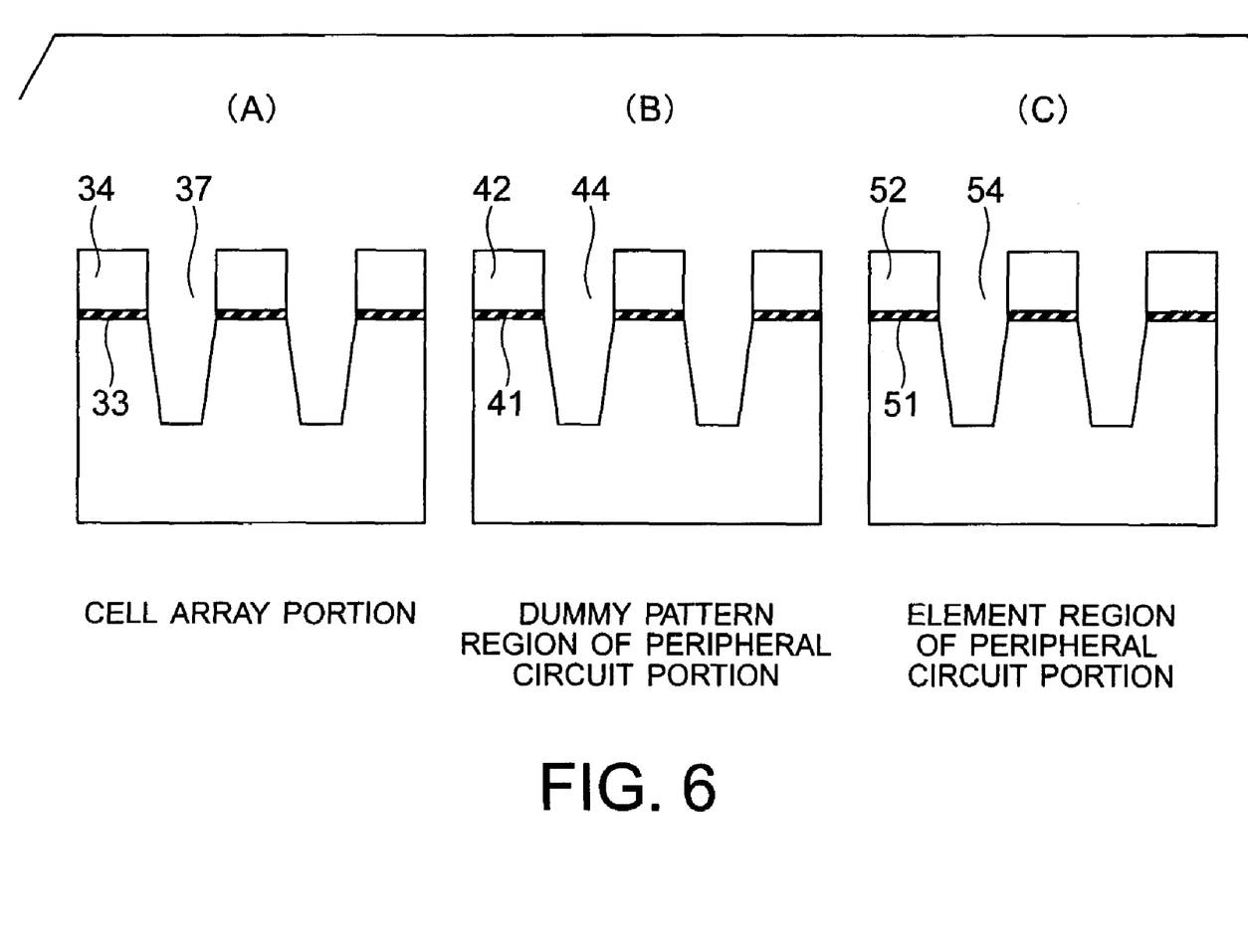
FIG. 6 is another schematic view illustrating cross sections in one process showing a method of manufacturing the semiconductor memory device in accordance with the aforementioned embodiment.

Next, as shown in FIGS. 6(A), 6(B) and 6(C), trenches 37, 44 and 54 are formed by anisotropic etching, such as reactive ion etching (RIE), using mask materials (not shown in the figures). Note that the trenches 37 are formed in a strip-shaped manner and the trenches 44 and 54 are formed in such a manner that the surface of the semiconductor substrate 31 is left over in a rectangular pattern.

Figure 7:
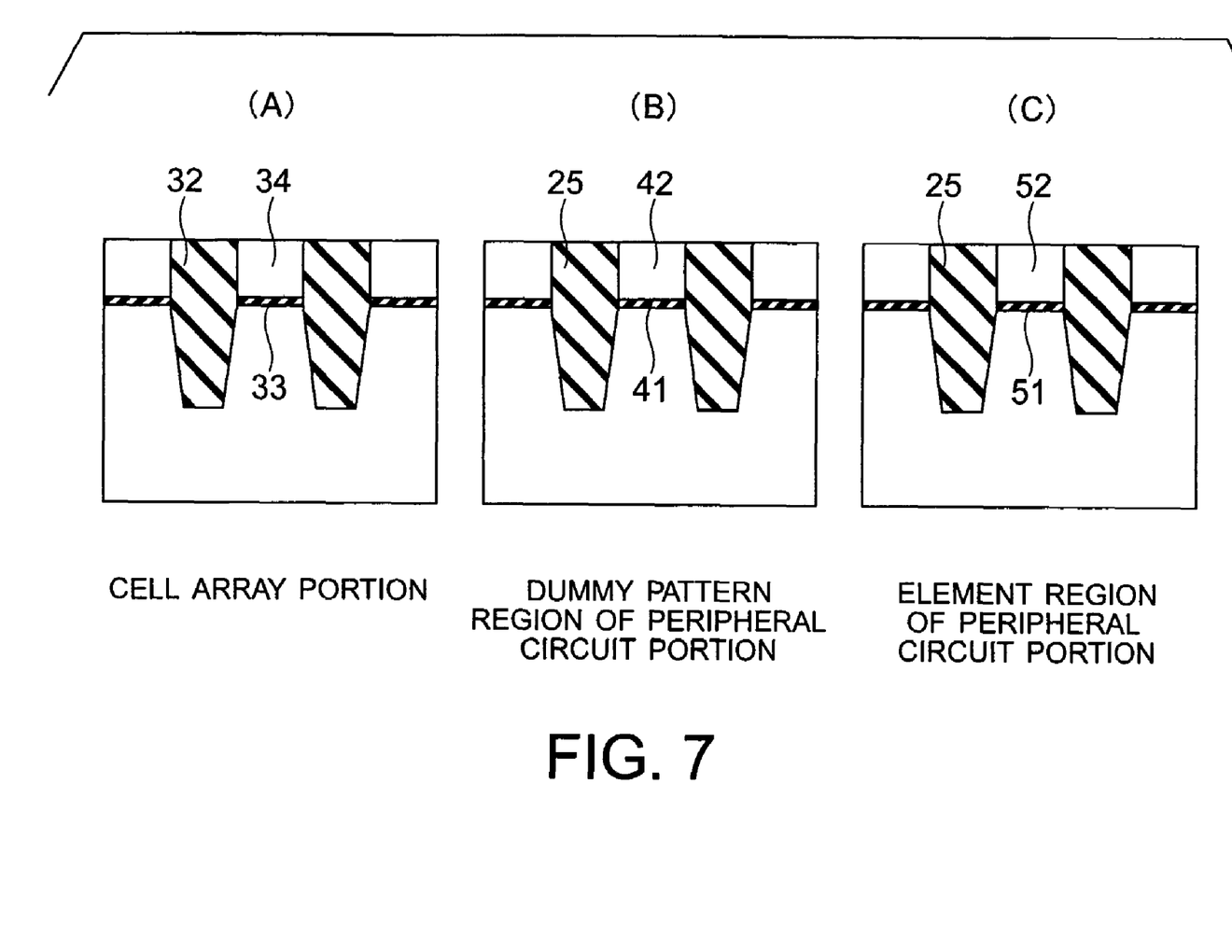
FIG. 7 is yet another schematic view illustrating cross sections in one process showing a method of manufacturing the semiconductor memory device in accordance with the aforementioned embodiment.

Next, as shown in FIGS. 7(A), 7(B) and 7(C), element-isolating insulating films composed of a silicon dioxide film or the like are deposited in the trenches 37, 44 and 54 using a CVD method, to form element-isolating regions 32 and 25. At this point, the upper surfaces of the electrode layers 34, 42 and 52 and the upper surfaces of the element-isolating regions 32 and 25 are formed by etching back so as to be level with each other.

Figure 8:
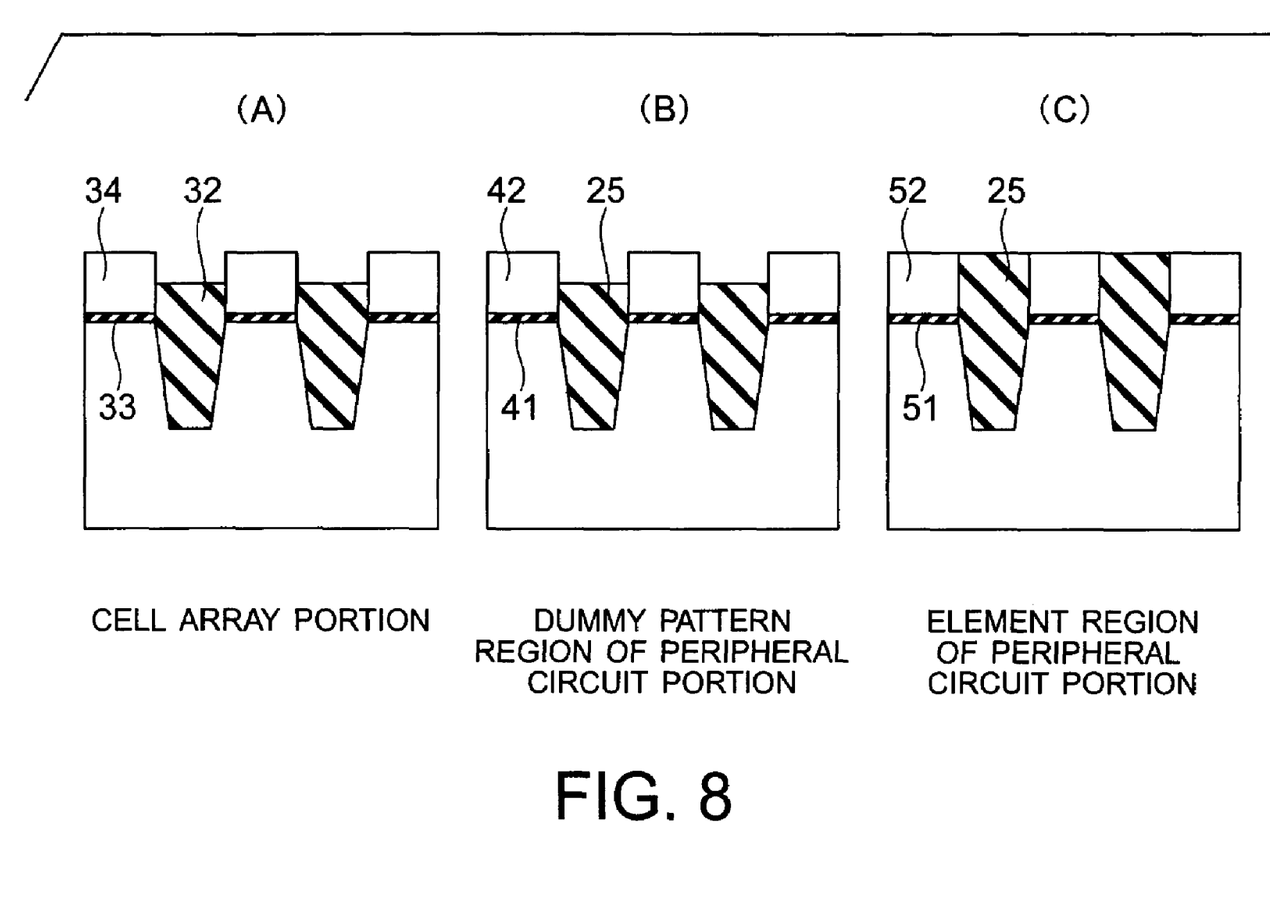
FIG. 8 is still another schematic view illustrating cross sections in one process showing a method of manufacturing the semiconductor memory device in accordance with the aforementioned embodiment.

Next, in the cell array portion and a dummy pattern region in the peripheral portion, the element-isolating insulating films are etched by RIE or the like to drop the element-isolating regions 32 and 25, as shown in FIGS. 8(A) and 8(B).

In the element regions of the peripheral portion, the element-isolating insulating films are not etched using a mask material (not shown in the figure), as shown in FIG. 8(C). Consequently, the height of the element-isolating regions 25 remains unchanged.

Figure 9:
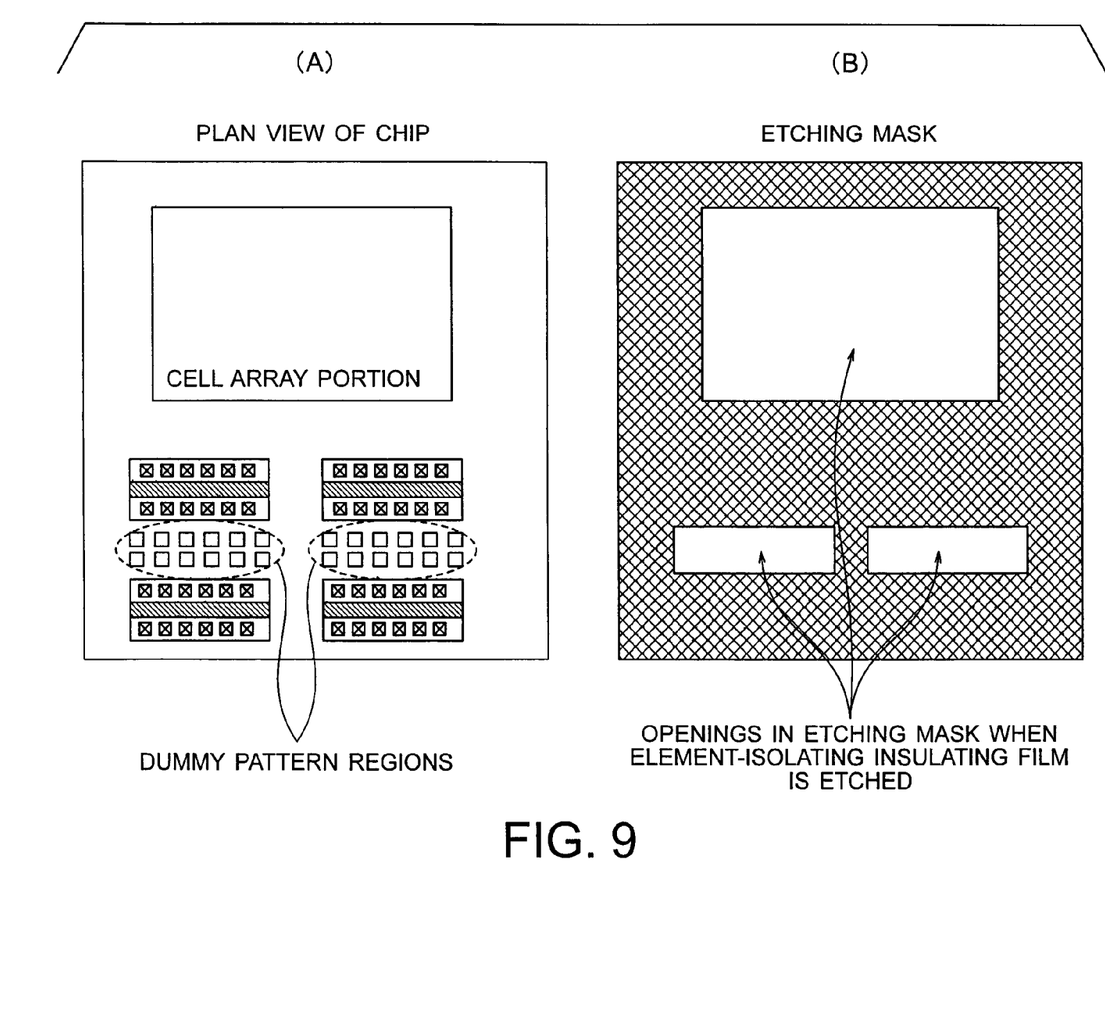
FIG. 9 is a schematic view illustrating an example of an etching mask used to manufacture the semiconductor memory device in accordance with the aforementioned embodiment.

In the case of a chip shown in FIG. 9(A), an etching mask used when anisotropically etching the element-isolating regions is such that openings are created only for the cell array portion and the dummy pattern regions in the peripheral portion, as shown in FIG. 9(B).

Then, insulating films 35, 43 and 53, such as an ONO film, are formed on the element-isolating regions 32 and 25 and on the electrode layers 34, 42 and 52. Furthermore, electrode layers 21, 45 and 55 composed of polysilicon or the like are deposited on these insulating films 35, 43 and 53 using a CVD method.

In the cell array portion and the element regions of the peripheral portion, the electrode layers 34, 21, 52 and 55 and the insulating films 33, 35, 51 and 53 on an impurity diffused layer are removed by etching such as RIE, trenches reaching to the surface of the semiconductor substrate 31 are formed, and diffused layers are formed by impurity implantation and heat treatment, though these processes are not illustrated. After going through such processes as described above, the semiconductor memory device has such a structure as represented by FIGS. 3(A), 3(B) and 3(C).

Figure 10:
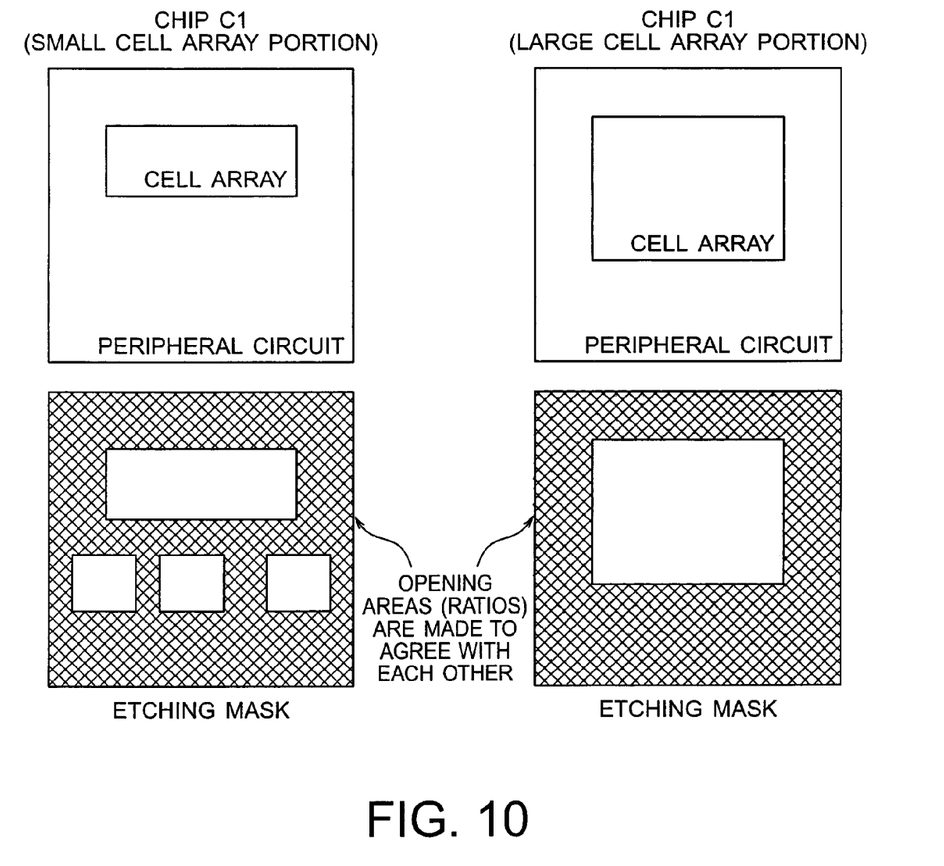
FIG. 10 is another schematic view illustrating examples of etching masks used to manufacture the semiconductor memory device in accordance with the aforementioned embodiment.

As shown in FIG. 10, in a chip C1 wherein the occupation ratio of a cell array portion is small, openings are created for the cell array portion and the dummy pattern region of a peripheral portion in an etching mask used when etching the element-isolating regions of the cell array portion. In a chip C2 wherein the occupation ratio of a cell array portion is large, an opening is created only for the cell array portion in an etching mask used when etching the element-isolating regions of the cell array portion.

Accordingly, it is possible to make the opening ratios of etching masks agree with each other between the chip 1 wherein the occupation area of the cell array portion is small and the chip 2 wherein the occupation area of the cell array portion is large. Consequently, the height of the element-isolating regions of the cell array portion from the surface of the semiconductor substrate is kept constant between the chip 1 and the chip 2 under the same etching conditions, thereby making it possible to prevent the coupling ratio from changing.

Note that the purpose of creating an opening in the etching mask also for the dummy pattern region of the peripheral portion is to make the opening ratio of the etching mask agree with that of a chip wherein the occupation area of a cell array portion is large. Therefore, it is only necessary in some cases to create an opening in part of the etching mask for the dummy pattern region of the peripheral portion.

In addition, there may be a case where opening ratios are not made to agree with each other simply by creating an opening for the dummy pattern region of the peripheral portion. In that case, an opening is also created for the element region of the peripheral portion so that the opening ratios agree with each other.

Figure 11:
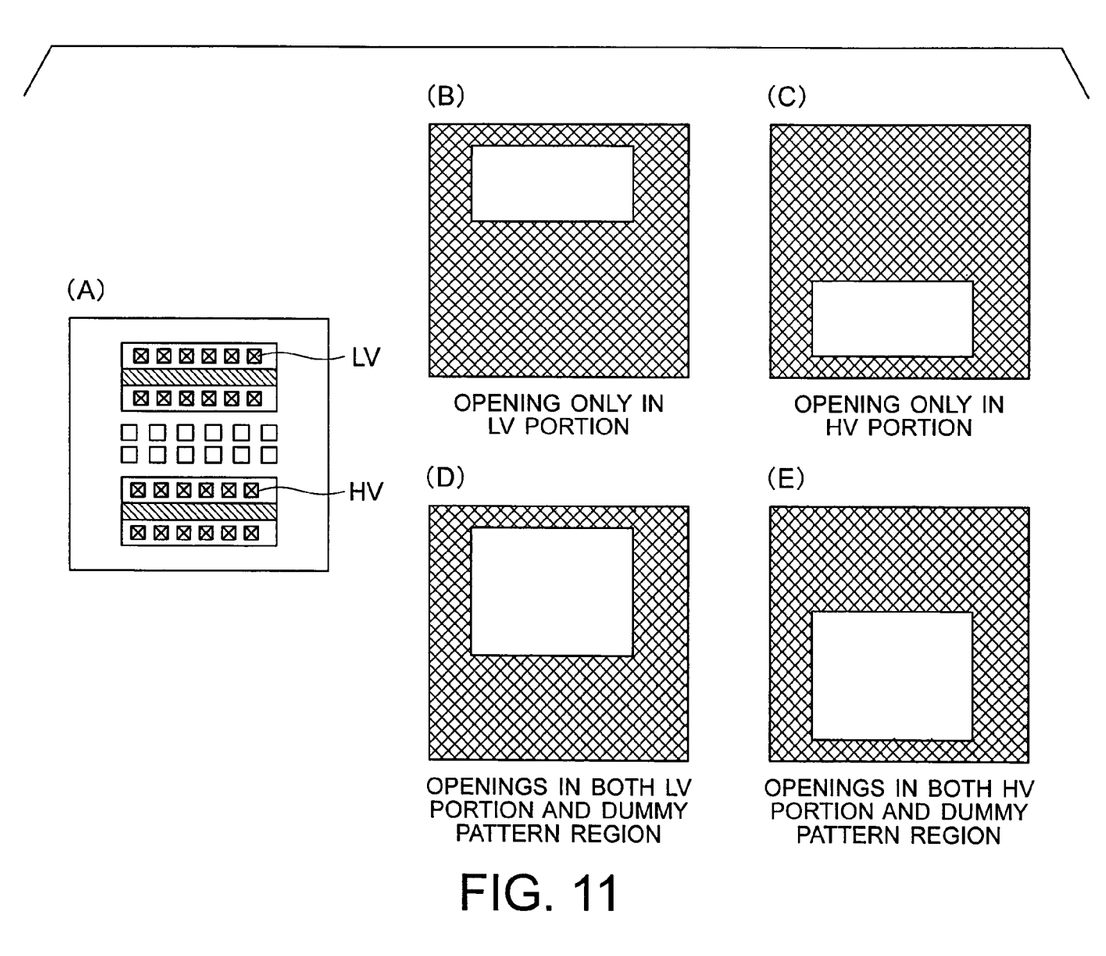
FIG. 11 is yet another schematic view illustrating examples of etching masks used to manufacture the semiconductor memory device in accordance with the aforementioned embodiment.

In some cases, the element region may have a region HV where high breakdown voltage MOS transistors are formed and a region LV where low breakdown voltage MOS transistors not required to have high breakdown voltages are formed, as shown in FIG. 11(A). The gate-insulating film 51 of a high breakdown voltage MOS transistor is formed so as to be thicker than that of a low breakdown voltage MOS transistor not required to have high breakdown voltages.

For example, in cases where element characteristics are not affected even if element-isolating regions in the region HV are etched, an opening is created for the region HV in addition to a dummy pattern region, to make opening ratios agree with each other, as shown in FIG. 11(E). In addition, in cases where element characteristics are not affected even if an element-isolating region in the region LV are etched, an opening is created for the region LV in addition to a dummy pattern region, to make opening ratios agree with each other, as shown in FIG. 11(D).

Alternatively, an opening may be created for the region HV rather than for the dummy pattern region, as shown in FIG. 11(C). Still alternatively, an opening may be created for the region LV rather than for the dummy pattern region, as shown in FIG. 11(B). Still alternatively, openings may be created for the region LV and the region HV rather than for the dummy pattern region. Still alternatively, an opening may be created for the entirety of the peripheral portion, i.e., the element-isolating regions in the whole area of the chip may be etched.

In the above-described embodiment, the opening ratios of etching masks are made to agree with each other in chips wherein the occupation areas of cell array portions differ from each other, by creating openings in the etching mask not only for the cell array portion but also for the dummy pattern region and element-isolating regions in the peripheral portion when etching the element-isolating regions of the cell array portion. Accordingly, it is possible to obtain a constant height of the element-isolating regions under the same etching conditions (time) for chips wherein the occupation ratios of cell array portions differ. Consequently, it is possible to upgrade product reliability.

What is claimed is:

1. A manufacturing method of a semiconductor memory device for manufacturing a first semiconductor device wherein a cell array ratio at which an area occupied by a memory cell array region with respect to the entire surface area of a semiconductor substrate is a predetermined ratio and a second semiconductor device wherein said cell array ratio is smaller than said predetermined ratio, said manufacturing method comprising:

forming a height of first element-isolating insulating films in a first memory cell array region of said first semiconductor device, wherein first electrode layers and the first element-isolating insulating films are initially formed with a first height from said semiconductor substrate, so as to be a second height smaller than the first height, by performing etching treatment under predetermined conditions using a reactive ion etching method upon the entirety of the first memory cell array region using a first etching mask having a first opening for exposing the entirety of said first memory cell array region and a ratio at which the area of said first opening occupies part of the entire surface area of said semiconductor substrate is a predetermined opening ratio; and forming a height of second element-isolating insulating films in a second memory cell array region and part of peripheral circuit region of said second semiconductor device, wherein second electrode layers and the second element-isolating insulating films are initially formed with the first height from said semiconductor substrate, so as to be the same as said second height, by performing etching treatment under conditions same as said predetermined conditions using a reactive ion etching method upon the second memory cell array region and the part of peripheral circuit region using a second etching mask having a second opening for exposing the entirety of said second memory cell array region and a third opening for exposing part of said peripheral circuit region wherein a ratio at which the sum of the areas of said second and third openings occupies part of the entire surface area of said second semiconductor substrate is the same as said predetermined opening ratio.

2. The manufacturing method of a semiconductor memory device according to claim 1, wherein part of said peripheral circuit region is a dummy pattern region.

3. The manufacturing method of a semiconductor memory device according to claim 1, wherein parts of said peripheral circuit region are a dummy pattern region and a region in which low breakdown voltage transistors are formed.

4. The manufacturing method of a semiconductor memory device according to claim 1, wherein parts of said peripheral circuit region are a dummy pattern region and a region in which high breakdown voltage transistors are formed.

5. The manufacturing method of a semiconductor memory device according to claim 1, wherein part of said peripheral circuit region is a region in which low breakdown voltage transistors are formed.

6. The manufacturing method of a semiconductor memory device according to claim 1, wherein part of said peripheral circuit region is a region in which high breakdown voltage transistors are formed.

7. The manufacturing method of a semiconductor memory device according to claim 1, wherein parts of said peripheral circuit region are regions in which low breakdown voltage transistors and high breakdown voltage transistors are formed.

* * * * *